United States Patent
Qiao et al.

(10) Patent No.: US 6,322,716 B1
(45) Date of Patent: Nov. 27, 2001

(54) METHOD FOR CONDITIONING A PLASMA ETCH CHAMBER

(75) Inventors: Jianmin Qiao, Fremont; Sanjay Thekdi, Santa Clara, both of CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/385,187

(22) Filed: Aug. 30, 1999

(51) Int. Cl.[7] .................................................. H01L 21/306
(52) U.S. Cl. .............................................. 216/67; 438/905
(58) Field of Search ............................. 216/67; 438/905; 134/1.1

(56) References Cited

U.S. PATENT DOCUMENTS

| | | |
|---|---|---|
| 4,211,601 | 7/1980 | Mogab . |
| 4,376,672 | 3/1983 | Wang et al. . |
| 4,412,885 | 11/1983 | Wang et al. . |
| 4,447,290 | 5/1984 | Matthews . |
| 4,666,555 | 5/1987 | Tsang . |
| 4,842,683 | 6/1989 | Cheng et al. . |
| 5,268,200 | 12/1993 | Steger . |
| 5,354,386 | 10/1994 | Cheung et al. . |
| 5,441,596 | 8/1995 | Nulty . |
| 5,468,342 | 11/1995 | Nulty et al. . |
| 5,514,247 | 5/1996 | Shan et al. . |
| 5,562,801 | 10/1996 | Nulty . |
| 5,583,737 | 12/1996 | Collins et al. . |
| 5,647,953 | * 7/1997 | Williams et al. ................ 216/67 |
| 5,814,563 | 9/1998 | Ding et al. . |
| 5,824,375 | 10/1998 | Gupta . |

FOREIGN PATENT DOCUMENTS

| | | |
|---|---|---|
| 0 078 161 | 5/1983 | (EP) . |
| 0 109 706 | 5/1984 | (EP) . |
| 0 691 678 | 1/1996 | (EP) . |
| 0 825 278 | 2/1998 | (EP) . |

OTHER PUBLICATIONS

Vochchenkov, "Plasma etching: An enabling technology for gigahertz silicon integrated circuits," J. Vac. Sci. Technol. A, vol. 11, No. 4, Jul. 1993, pp. 1211–1220.

* cited by examiner

Primary Examiner—Thi Dang
(74) Attorney, Agent, or Firm—Devin L. Daffer; Conley, Rose & Tayon P.C.

(57) ABSTRACT

A method for conditioning a plasma etch chamber is presented. A plasma etch chamber is provided, which preferably includes a chuck for supporting a topography. A conditioning process may be performed in the etch chamber. The conditioning process preferably includes positioning a cover topography on or above the chuck. A conditioning feed gas containing (hydro)halocarbons may be introduced into the chamber. A conditioning plasma may be generated from the conditioning feed gas for a conditioning time. Immediately after generating the conditioning plasma is complete, the overall thickness of the cover topography is preferably at least as great as immediately before generating the conditioning plasma. By performing a conditioning process in such a manner, the total cost and complexity of the conditioning process may be reduced.

20 Claims, 5 Drawing Sheets

METHOD FOR CONDITIONING A PLASMA ETCH CHAMBER

BACKGROUND OF THE INVENTION

1. Field of the Invention

This invention relates to semiconductor fabrication and, more particularly, to a method for conditioning plasma etch chambers in which, e.g., a cover topography is positioned upon a chuck within the chamber and a conditioning plasma is generated such that the thickness of the cover topography immediately after generating the conditioning plasma is at least as great as the thickness of the cover topography immediately before generating the conditioning plasma.

2. Description of the Related Art

The information described below is not admitted to be prior art by virtue of its inclusion in this Background section.

Conditioning processes are commonly implemented in semiconductor fabrication to prepare plasma chambers for the optimal performance of plasma processes. When used with plasma etch chambers, conditioning processes typically involve generating a conditioning plasma in the plasma chamber for a predetermined length of time to prepare, or "season", the chamber for the performance of etch processes with production wafers. The parameters of the conditioning process (e.g., RF power, feed gas composition, and pressure) are usually maintained at or near the parameters of the corresponding etching process for which the chamber is being conditioned. In this manner, conditioning processes can help ensure that all etch processes performed in an etch chamber produce results within a desired range.

One important way that plasma etch chamber conditioning processes help prepare an etch chamber for etch processing is through the deposition of polymeric material on plasma chamber inner surfaces. Plasma etch processes often use a variety of (hydro)halocarbons as etchants. The particular class of (hydro)halocarbon selected generally depends on the material being etched. For example, (hydro) fluorocarbon plasmas are commonly used to etch dielectric materials such as silicon dioxide. By using certain combinations of etchant gases (with other gases, such as inert gases, potentially mixed in), materials on the upper surface of a semiconductor topography (i.e., a semiconductor substrate and any overlying materials) can be etched. While etching plasmas formed from (hydro)halocarbons can etch material on the upper surface of a semiconductor topography, such plasmas often concurrently deposit thin layers of polymeric material on the relatively colder (in relation to the upper surfaces of the semiconductor topography being processed) inner surfaces of the plasma chamber, such as the etch chamber inner walls. Since plasma etch chamber conditioning plasmas are usually generated under similar conditions as a corresponding etching plasma, the conditioning plasmas can be used to deposit layers of polymeric material having a similar composition to the polymeric material deposited over the course of normal etch processing.

The ability of plasma etch chamber conditioning processes to deposit polymers on chamber inner surfaces is particularly important when conditioning an etch chamber after cleaning. Plasma etch chambers are periodically cleaned to remove contaminants that collect on the inner surfaces of the etch chamber during processing. Cleaning of such chambers may be carried out using wet cleaning processes (i.e., processes that use liquid etchants to remove materials from the chamber inner surfaces) or dry cleaning processes (i.e., processes that use plasmas to remove materials from the chamber inner surfaces). Regardless of the type of cleaning process used, trace residues of the chemicals used in the cleaning process may remain on the chamber inner surfaces after cleaning. By performing conditioning processes, layers of polymeric materials may be deposited on the chamber inner surfaces that serve to trap these residues, as well as other contaminants, and thus reduce contamination during subsequent processing.

Conditioning processes may also be used to replace the deposited polymeric films removed during cleaning and thus improve initial plasma behavior in subsequent etch processing. The deposited polymeric films may act as insulators, and thus can affect the coupling condition of plasmas formed therein. In addition to removing contaminants that have accumulated within an etch chamber during processing, however, cleaning processes also remove the polymeric films deposited on the chamber inner surfaces. Since the etch process parameters are typically designed to account for the insulating effects of these polymeric layers, any etch processes performed in the absence of such layers may not produce the desired results (e.g., because of direct coupling of the plasma to the chamber walls). Conditioning processes performed after cleaning may be used to deposit a polymeric layer having insulating properties similar to the polymeric layers deposited during normal processing and sufficiently thick to help ensure that the plasmas formed in subsequent etch process behave as intended.

Conditioning processes may also be used to heat-up the inner surfaces of an etch chamber after an extended idle period (or first use). Generally speaking, plasma etch processes are typically performed on several wafers or sets of wafers in a series of sequential process steps. Processing of production wafers does not continue indefinitely, however, but may instead be periodically halted for numerous reasons, including cleaning processes, repairs, and simple idle time. During such intermissions, the inner surfaces of the chamber may cool. If etch processing is resumed or initiated in a chamber having inner surfaces substantially cooler than during normal processing, the initial etching performance may be sub-optimal. To overcome such problems, relatively shorter conditioning processes may be use to elevate the temperature of the inner surfaces of the plasma chamber to levels at or near the temperatures of the inner surfaces during normal processing. In this manner, conditioning processes may improve the initial performance of an etch process after an extended idle period.

One way in which plasma etch chamber conditioning processes differ from regular etch processes is that the chuck is typically covered by a dummy wafer instead of by a production wafer as in normal etch processes. It is generally undesirable for reactive species (whether generated from a conditioning plasma or from a normal etching plasma) to contact the upper surface of a chuck. While the upper surface of the chuck is covered by a production wafer during normal processing, production wafers are usually not left within a chamber during chamber conditioning. Consequently, a dummy wafer is used to cover the chuck while conditioning is performed.

Generally speaking, a dummy wafer is a wafer used in place of a production semiconductor wafer during a process step but from which semiconductor devices are not produced. Dummy wafers are typically devoid of preformed patterns and have substantially planar upper surfaces. A variety of dummy wafer types may be used in semiconductor processing, including ceramic wafers (e.g., aluminum oxide and aluminum nitride wafers) and silicon wafers (e.g., oxide-coated, photoresist-coated, and bare silicon wafers).

Because of their relatively lower cost, ceramic and bare silicon or oxide-covered silicon wafers are commonly used in plasma enhanced deposition chambers. Since PECVD processes deposit materials instead of etching them, concern about the particular materials of which the dummy wafers are constructed is more limited. Consequently, a variety of dummy wafer types may be freely used in plasma enhanced deposition chamber conditioning processes for plasma enhanced deposition chamber, even when the conditioning processes closely replicate deposition conditions.

Unfortunately, plasmas formed in conventional etch chamber conditioning processes can etch the upper surface of the dummy wafers, limiting the types of wafers that can be used as dummy wafers and increasing the cost and complexity of the conditioning process. For example, if bare silicon dummy wafers are used to cover the chuck during conventional etch chamber conditioning, these wafers will be etched by the conditioning plasma (as they would be by the corresponding etching plasma). The etching of the exposed silicon surface of such wafers can create byproducts within the chamber that are incorporated into the polymeric films deposited on the etch chamber inner surfaces. These byproducts may not be present during the corresponding etch processes (at least not to the same extent), and thus the polymeric films deposited on the chamber inner surfaces can have undesirable properties.

Ceramic wafers may suffer a similar problem. As stated above, aluminum is a common component of ceramic dummy wafers. If these wafers are etched during a conventional conditioning process, the polymeric film deposited on the inner surface could contain aluminum. Not only can these aluminum byproducts undesirably alter the properties of the deposited polymeric films, but they may also leach out during subsequent etch processing, potentially producing a further contamination risk.

Because of the problems faced when using the above-mentioned dummy wafers in conventional etch chamber conditioning processes, photoresist-coated dummy wafers are often used in such processes instead. While the photoresist coating of such wafers is still etched by conventional conditioning plasmas, the byproducts formed through the etching of resist may be configured to be similar to what is produced in normal processing. Since the etching of photoresist does not deleteriously affect the quality of the conditioning process, photoresist coated wafers are frequently used in conventional etch chamber conditioning processes.

Unfortunately, the need to use more expensive wafers such as photoresist-coated wafers can increase the cost of conventional etch chamber conditioning processes. As stated above, the initial costs of a photoresist-coated dummy wafer are often higher than that of, e.g., ceramic wafers. In addition, since conventional conditioning plasmas etch photoresist, photoresist-coated dummy wafers must be periodically reworked to maintain a sufficiently thick photoresist coating. As might be expected, frequent reworking of photoresist-coated wafers adds to the total cost of conventional etch chamber conditioning processes.

Furthermore, the etching properties of conventional conditioning processes may help create a undesirably complex conditioning process. For example, photoresist-coated wafers often use silicon wafers as a substrate. If the photoresist coating is allowed to be entirely etched away during conditioning, the underlying substrate may be etched, potentially producing some of the undesired effects discussed above. Consequently, the thickness of the photoresist coating of such dummy wafers must be closely monitored to ensure proper conditioning performance. In addition, not only does the need to frequently rework the photoresist-coated dummy wafers raise the cost of conventional conditioning processes, but it also undesirably increases the complexity of these processes.

The need to closely monitor and frequently rework photoresist-coated wafers when used in conventional conditioning processes is particularly a concern with plasma etchers incorporating dummy wafer slots. Dummy wafer slots are used in many plasma etchers to retain dummy wafers within the etching tool when the dummy wafers are not being used in, e.g., conditioning processes. Instead of having to transfer a dummy wafer in and out of an etch tool each time conditioning is performed, a tool with dummy wafer slots can retain the dummy wafers in the slots to be used as needed. Unfortunately, tool operators sometimes neglect to remove and replace the photoresist-coated dummy wafers within the dummy slots at desired intervals. When this happens, the conditioning plasma can, over several processing iterations, eventually etch through the photoresist coating and attack the underlying substrate. If allowed to continue over a substantial period, the structural integrity of the dummy wafer may be reduced to the point where the dummy wafer crumbles and breaks within the dummy wafer slot. Cleaning up such breakage is not easy, and may result in the tool being taken off-line, causing loss of valuable production time. In addition, the dummy wafers slots in many plasma etchers are not easily accessed. Consequently, the need to frequently remove dummy wafers from such dummy wafer slots for reworking may increase the complexity of conventional conditioning processes.

Therefore, it would be desirable to develop a method for conditioning a plasma etch chamber that did not require the frequent replacement and/or reworking of a dummy wafer used in the conditioning process. It would also be desirable to produce a plasma etch chamber conditioning method that did not require more expensive dummy wafers, such as photoresist-coated dummy wafers, to cover the chuck during conditioning. The desired method should not require the use of a conditioning feed gas chemistry significantly different than the corresponding etching feed gas chemistry of the etch process for which the method is conditioning the chamber.

SUMMARY

The problems described above are in large part resolved by the method for conditioning a plasma chamber provided herein. A plasma etch chamber is provided, which preferably includes a chuck for supporting a topography. A conditioning process may be performed in the etch chamber. The conditioning process preferably includes positioning a cover topography on or above the chuck. A conditioning feed gas containing (hydro)halocarbons may be introduced into the chamber. A conditioning plasma may be generated from the conditioning feed gas for a conditioning time. Immediately after generating the conditioning plasma is complete, the overall thickness of the cover topography is preferably at least as great as immediately before generating the conditioning plasma. By performing a conditioning process in such a manner, the total cost and complexity of the conditioning process may be reduced.

Unlike conventional plasma etch chamber conditioning processes in which portions of a cover topography are etched away during processing (reducing the thickness of the topography), the present process preferably ensures that the overall thickness of a cover topography is not reduced by the conditioning plasma. That is, the thickness of the cover topography (i.e., a substrate and any overlying layers capable of covering a chuck) at all points across the topography immediately after generating the conditioning plasma is at least as great as the thickness of the respective points immediately before generating the conditioning plasma. Consequently, the present conditioning process may be efficaciously used with a greater variety of cover topographies than conventional conditioning processes, including oxide-coated single-crystal silicon substrates. Since such cover topographies are often cheaper than the more expensive topographies, such as photoresist-coated dummy wafers, that many conventional conditioning processes require for effective operation, the present conditioning method may allow total conditioning cost to be reduced.

Furthermore, the present conditioning process is preferably less complex than conventional etch chamber conditioning processes. For example, many conventional conditioning processes require that the photoresist-coated dummy wafers be frequently replaced for reworking to prevent the photoresist coating from being entirely etched away during conditioning. The present conditioning process, however, preferably ensures that the thickness of a cover topography across the topography is not reduced by the conditioning plasma. As a result, the need to frequently replace a cover topography for reworking may be eliminated.

The present method also preferably reduces the need to constantly monitor the cover topography over the course of several conditioning processes. Because the present process preferably ensures that the thickness of a cover topography across the topography is not reduced by the conditioning plasma, the likelihood of the conditioning plasma etching the underlying substrate of a cover topography is greatly reduced. This feature may be of particular benefit when using plasma etchers that have dummy wafer slots, as the present method allows a cover topography to be left a dummy wafer slot for a greater period time than in conventional conditioning processes without fear of etching the cover topography to the point of breakage.

As stated above, the conditioning feed gas may include (hydro)halocarbons. (A (hydro)halocarbon may be considered a compound that contains carbon and a halogen and that may optionally contain hydrogen.)The characteristics of a (hydro)halocarbon plasma may be in large part determined by the ratio of halogen atoms to carbon atoms in the feed gas from which a plasma is formed. A "normal" ratio may be considered 4 halogen atoms for each carbon atom (which is the ratio for $CF_4$, a common (hydro)fluorocarbon etchant). A plasma formed from a (hydro)halocarbon gas having a halogen/carbon (H/C) ratio of 4, will tend to etch, e.g., silicon or silicon dioxide at the processing conditions commonly used in semiconductor manufacturing.

By altering the H/C ratio of a (hydro)halocarbon feed gas, the etching tendency of the plasma formed from that gas may be altered. For example, a plasma generated from (hydro)halocarbon gas having a H/C ratio above 4 may have an increased tendency to etch a given material at a given set of process conditions relative to a plasma generated from a (hydro)halocarbon gas having a H/C ratio of 4. By comparison, a plasma generated from a (hydro)halocarbon gas having a H/C ratio below 4 (i.e., halogen-deficient gases) may have an decreased tendency to etch a given material at a given process set of process conditions relative to a plasma generated from a (hydro)halocarbon gas having a H/C ratio of 4.

At certain process conditions, though, a plasma formed with a halogen-deficient feed gas will not continue to tend to etch materials but will instead tend to shift into a polymerization mode in which the plasma deposits an amount of polymeric material on the surface of a material sufficient to inhibit or prevent that material from being etched. Thus, if a plasma formed from a particular gas tends to etch at a given set of process parameters (power supplied, pressure, etc.), then that gas may be considered an etching gas for those process parameters. Conversely, if a plasma formed from a particular gas tends to deposit sufficient levels of polymeric material to inhibit or prevent etching at a given set of parameters, then that gas may be considered an polymer-forming gas for those conditions. Accordingly, a polymer-forming component of a feed gas may be considered to include all gases that tend to be deposit polymer in sufficient amounts to inhibit or prevent etching at the process conditions at which the conditioning plasma is generated. Similarly, an etching component of a feed gas may be considered to include all gases that tend to etch at the process conditions at which the conditioning plasma is generated.

Of course, the terms etching and polymer-forming may be dependent on the material at the upper surface of the material exposed to the plasma. For example, a plasma may be considered polymer-forming with respect to one material and etching with respect to another. For the present method, polymer-forming gases are preferably polymer-forming with respect to all materials commonly used in semiconductor manufacturing, and particularly with respect to dielectric materials, at the particular process parameters.

In a preferred embodiment, the conditioning feed gas includes an etching component and a polymer-forming component. The conditioning plasma may be generated from the conditioning feed gas for a time sufficient to deposit polymeric material on the upper surface of cover topography on or above the chuck within the chamber. To this end, the polymer-forming component within the conditioning feed gas is preferably of sufficient quality and quantity that a conditioning plasma generated from the conditioning feed gas may deposit polymeric material on the upper surface of the cover topography at a deposition rate at least as great as a rate at which said conditioning plasma etches the upper surface of said cover topography. The deposited polymeric material preferably forms a layer of polymeric material across the upper surface of the cover topography. Once formed, the layer of polymeric material preferably aids in inhibiting or preventing the etching of underlying portions of the cover topography.

Preferably, the conditioning process is configured such that the overall thickness of the cover topography is greater immediately after said generating a conditioning plasma than immediately before said generating a conditioning plasma. The polymeric material deposited across the upper surface of the cover topography during the conditioning process preferably serves to increase the thickness of the cover topography. The increase in overall thickness is preferably relatively slight, though: the deposition rate of depositing polymeric material across the surface of the cover topography may be less than 10 angstrom per minute, and is preferably less than 3 angstroms per minute. In addition, the conditioning time is preferably between 0.5 and 10 minutes, and more preferably is about 30 seconds. Limiting the rate and extent of polymeric deposition preferably reduces the chance that the deposited polymeric material will peel off the cover topography and possibly interfere with the outcome of subsequent etch processes.

The conditioning feed gas may contain (hydro) fluorocarbons. (A (hydro)fluorocarbon may be considered a compound that contains carbon and fluorine and that may optionally contain hydrogen.) Preferably, both the etching and polymer-forming components of the feed gas contain (hydro)fluorocarbons. The polymer-forming component preferably includes a polymer-forming gas having a relatively low fluorine/carbon (F/C) ratio. Preferably, the F/C ratio of the polymer-forming gas is below 3; more preferably the F/C ratio of the polymer-forming gas is at most about 2. Suitable polymer-forming (hydro)fluorocarbon gases include Freon 134 ($CHF_2$—$CHF_2$), octafluorocyclobutane ($C_4F_8$) and trifluoromethane ($CHF_3$).

The polymer-forming component preferably contains a volume percentage of polymer-forming gases sufficient to create a polymer-forming plasma at the desired conditioning process parameters. The amount of polymer-forming component necessary to produce the desired results depends on the volume percentage of the etching component within the conditioning feed gas, the particular etching gases within the etching component (and particularly their F/C ratio), as well as, of course, process parameters such as RF power applied, pressure, etc. In addition, the volume percentage of polymer-forming component needed to create a polymer-forming plasma also depends on the particular polymer-forming gases used. For example, Freon 134 has a significantly lower F/C ratio than trifluoromethane, and thus a conditioning feed gas may require significantly less Freon 134 than trifluoromethane to shift a conditioning plasma into polymer-forming mode. In an embodiment in which the temperature at the upper surface of the cover topography is about 100° C., a given volume of Freon 134 may produce similar polymer-forming results to a volume of trifluoromethane ten times as large.

In addition to depositing a polymeric material on the surface of the cover topography, the conditioning plasma also preferably deposits polymeric material on inner surfaces of the etch chamber (e.g., the chamber inner walls and/or liners). Additionally, the present conditioning process also elevates the temperature of the inner surfaces of the plasma etch chamber. As such, the process may be used to condition a etch chamber after an extended delay in etch processing.

The present conditioning process preferably allows a variety of cover topographies to be used in the conditioning process. In an embodiment, the cover topography is a dummy topography. The dummy topography is preferably devoid of preformed patterns and has a substantially planar upper surface. The dummy topography preferably includes a single-crystal silicon substrate. An oxide layer may overly the substrate, and preferably covers the upper surface of the substrate. Other types of cover topographies may be used as well, including photoresist-coated and even bare single-crystal silicon substrates and ceramic substrates.

The present method is preferably capable of achieving the desired benefits without significantly altering the conditioning feed gas chemistry from the etching feed gas chemistry of the etching process for which the etch chamber is being conditioned. In an embodiment, the cover topography is removed from the chuck after the conditioning plasma is generated. An etching process may then be performed after the conditioning process. The etching process preferably includes positioning a semiconductor topography upon the chuck. An etching feed gas containing (hydro)halocarbons is then introduced into the chamber. The etching feed gas preferably includes a polymer-forming hydro)halocarbon component and an etching component. The percentage of the polymer-forming component within the conditioning feed gas is preferably higher than the volume percentage of the polymer-forming component within the etching feed gas. Preferably, the chemical composition of the etching component within the conditioning feed gas is substantially the same as the chemical composition of the etching component within the etching feed gas. In this manner, the present method may produce the desired conditioning results (e.g., deposited polymeric material composition similar to that of the etching process) while still reducing the cost and complexity of the overall chamber conditioning process.

BRIEF DESCRIPTION OF THE DRAWINGS

Other objects and advantages of the invention will become apparent upon reading the following detailed description and upon reference to the accompanying drawings in which.

Figure 1:
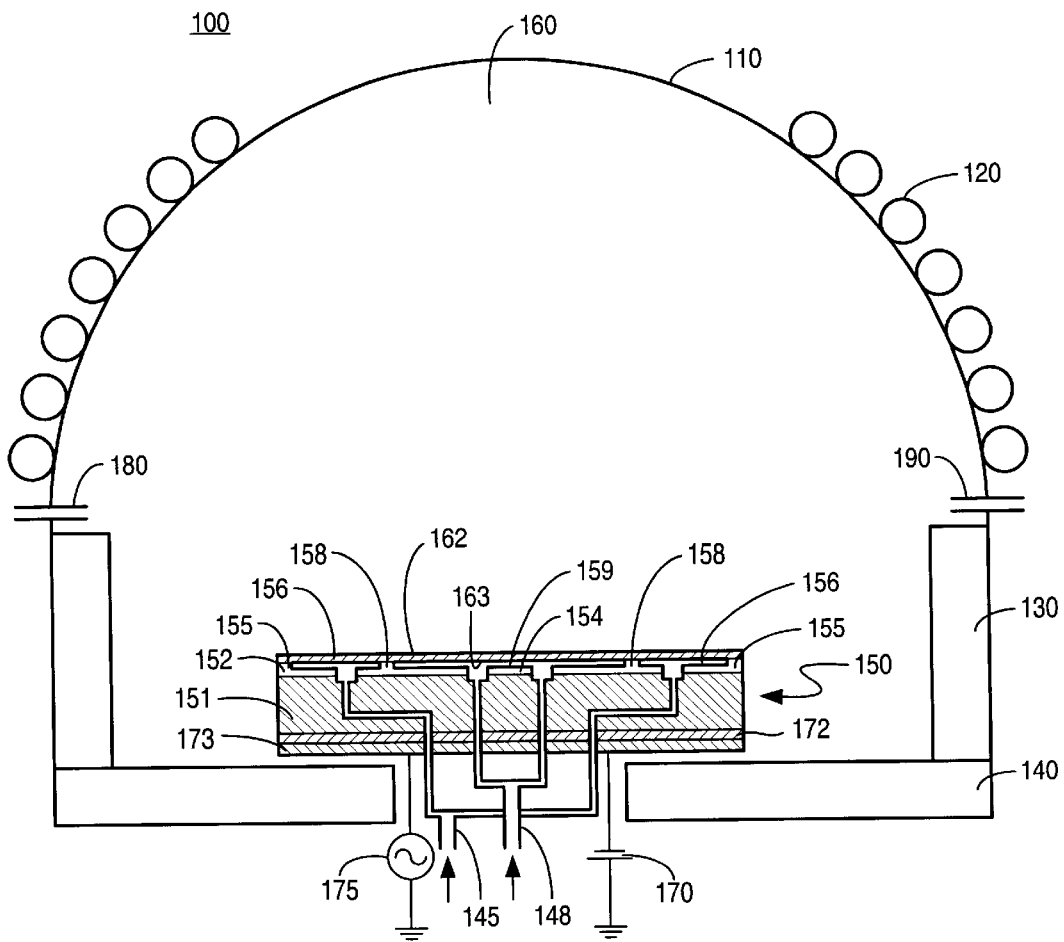
FIG. 1 is a schematic view of a high density plasma (HDP) etch chamber suitable for use with an embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

FIG. 1 presents a schematic view of an HDP etch chamber 100, suitable for use with the present conditioning method. Chamber 100 preferably includes an electrostatic chuck assembly 150, a chamber sidewall 130, a chamber base 140, a chamber ceiling 110, an induction coil 120, an RF power source 175 and a DC bias source 170. Gases may be introduced into the chamber through gas inlet 180 and exhausted from the chamber through gas outlet 190.

The electrostatic chuck assembly 150 may also include a DC electrode 151, an insulator 172, an RF electrode 173 and an electrostatic chuck seal 152. A cover topography 162 is shown positioned upon the chuck assembly. Topography 162 may be supported by electrostatic chuck seal 152. The electrostatic chuck assembly 150 may include a plurality of independently controllable cooling zones, two of which are shown in FIG. 1 as reference numerals 156 and 159. Each of the peripheral and central cooling zones 156 and 159 may be supplied with inert cooling gas(es), such as, for example, nitrogen, helium or argon via gas conduits 145 and 149. Conduits 145 and 148 may be connected to conventional pressure sensors and controllable valves (not shown) that sense and regulate, respectively, the coolant gas pressure within each of the coolant peripheral and central zones 156 and 159. The peripheral and central coolant zones 156 and 159 may be formed and delimited by an electrostatic chuck seal 152 that includes a seal base 154 and at least a peripheral seal 155 and a central seal 158. The peripheral seal 155 and the central seal 158 may be integral to the seal base 154. The electrostatic chuck seal 152, including the seal base 154, the peripheral seal 155 and the central seal 159 (and additional seals to create the additional cooling zones, if present) may be integral to the electrostatic chuck assembly 150 or may be separate therefrom, and may be made of a dielectric material such as, e.g., polyimide or a ceramic material. Chuck seal 152 should preferably be a DC insulator and be transparent to the applied RF bias. Alternately, chuck assembly 150 may be a mechanical chuck; in such a case, seal 152 may be made of one or more conducting materials.

In the case of an electrostatic chuck, a topography, such as cover topography 162, may be supported above the seal base 154 at least by the peripheral 155 and the central seal 158, and maintained securely thereat by electrostatic attraction created by the DC bias applied by DC bias source 170. The peripheral seal 155, together with the central seal 158, may form the peripheral coolant zone 156. The peripheral seal 155 may also prevent the cooling gas(es) supplied to the peripheral zone 156 via conduit(s) 145 from escaping into interior 160 of chamber 100.

As shown in FIG. 1, the coolant gas or gases may be supplied to peripheral and central cooling zones 156 and 159. As such, the inert gas supplied via the conduits 145 and 149 may impinge upon the backside 163 of cover topography 162. By independently controlling the temperature and/or pressure of the inert gas(es) impinging upon the backside 163 of the wafer 162 across the cooling zones 156 and 159, excellent temperature uniformity may be achieved across the width of topography 162.

Once a properly configured feed gas is introduced into chamber 100, a plasma can be generated within the chamber by applying RF power to RF electrode 173 (located beneath cover topography 162) from RF power source 175 and RF power to induction coil 120. By appropriately configuring the power supplied, the desired plasma may be generated. As those of ordinary skill will recognize, FIG. 1 does not necessarily show all parts of a functioning process chamber; the figure is merely intended to illustrate one possible chamber with which the present conditioning process may be implemented. The present method may be implemented in a variety of etch chamber designs in addition to an HPD etch chamber as shown in FIG. 1. For example, a medium density plasma (MDP) etch chamber may be used as well. Broadly speaking, MDP etch chambers may not utilize a separate induction coil to which power is supplied as in chamber 100. MDP chambers often include permanent or electro-magnets around chamber wall to, e.g., increase radial plasma uniformity. When using such a chamber, the desired plasma may be created by applying an appropriate RF power to the bottom electrode (such as electrode 173) of the MDP chamber.

Whatever the type of plasma chamber (i.e., reactor) used, the chamber is preferably configured to etch materials placed within the chamber, and more preferably is configured to etch materials using reactive ion etching (i.e., by using an electrical discharge to ionize and induce ion bombardment of the wafer surface to obtain the required etch properties). Consequently, the preferred etch chamber preferably is configured to generate a plasma though application of RF power to an electrode beneath and/or in contact with a topography positioned upon a chuck. The chamber is preferably a single-wafer chamber, but maybe configured for batch operation. The chamber is preferably part of a processing tool. The processing may be, e.g., a single chamber tool or a multi-chamber cluster tool. In a preferred embodiment, the plasma etch chamber may be selected from the MxP series obtainable from Applied Materials (Santa Clara, Calif.).

Figure 5:
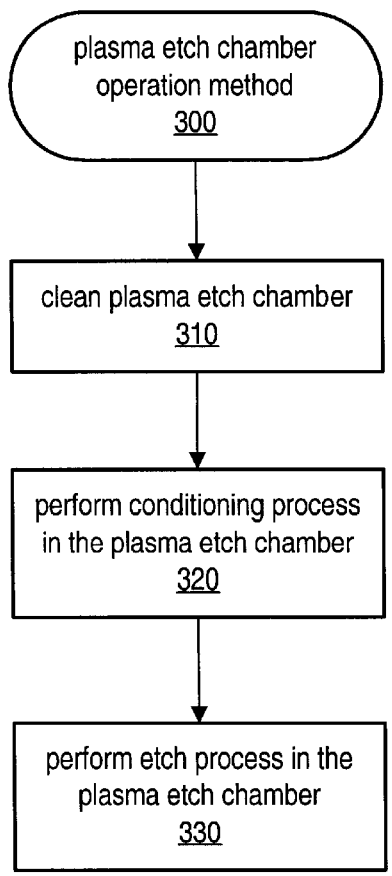
FIG. 5 is a flow diagram of a method for operating a plasma etch reactor in accordance with an embodiment.

FIG. 5 presents a flow chart of a method for operating a plasma etch chamber. operating method 300 will be described herein with regard to etch chamber 100, but may be performed with any variety of plasma etch chambers. Operating method 300 may be performed in any variety of situations during the course of manufacturing processes using etch chamber 100. In particular, operation method 300 may be performed at a point in a manufacturing sequence where it would be desirable to clean the etch chamber.

Once etch processing is terminated, chamber 100 may be cleaned (step 310). Any variety of wet or dry cleaning processes may be used to clean chamber 100. Preferably, chamber 100 is wet cleaned. After cleaning, a conditioning process may be performed in the etch chamber (step 320). Once the conditioning process is complete, the chamber may be brought back up to production, and an etching process may be performed in the chamber (step 330). Etching process 330 may be repeated as long as desired. Once chamber 100 again requires cleaning, the steps of operation method 300 may be repeated.

Figure 6:
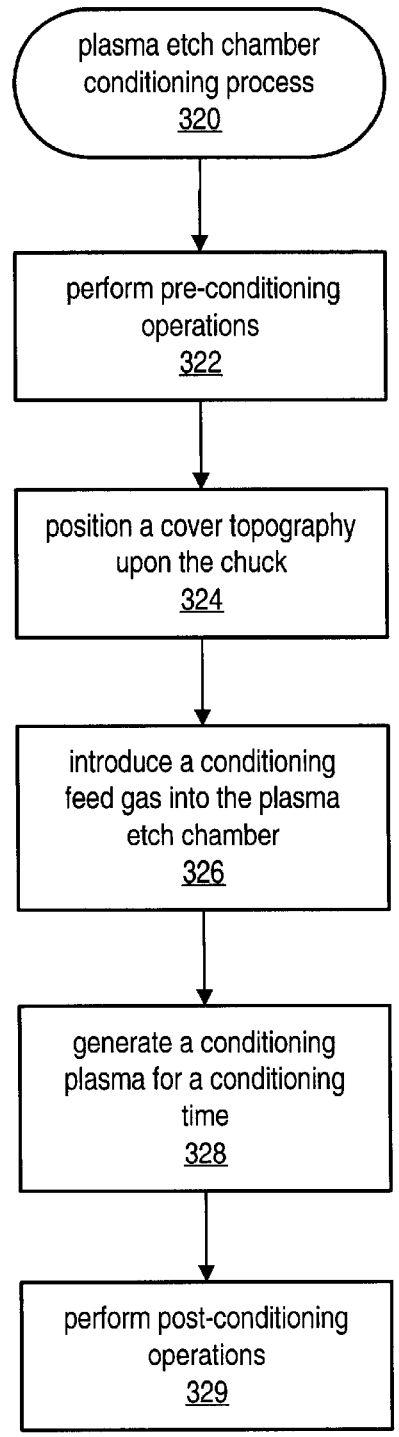
FIG. 6 is a flow diagram of a plasma etch chamber conditioning process that may be performed as part of the method shown in FIG. 5.

FIG. 6 presents a flow diagram for conditioning process 320, which may be performed as part of operation method 300. To prepare etch chamber 100 for conditioning, a variety of pre-conditioning operations may be performed (step 322). Pre-conditioning operations may be considered those operations performed as part of the conditioning process that prepare the chamber for the generation of a conditioning plasma. These steps may vary depending on the configuration and condition of the chamber. If cleaning process 310 is performed using wet cleaning methods, then chamber 100 may be exposed to the ambient environment, thus breaking any vacuum to within the chamber. In such a case, the pre-conditioning operations may include performing a vacuum pump down of the chamber to lower the pressure within the chamber to a desired level (preferably <1 mTorr). If cleaning process 310 is performed using dry cleaning methods, than a pump-down step may not be necessary (but may nevertheless be performed). The pre-conditioning operations may also include a pass leak rate test to determine the degree to which chamber 100 is airtight. Preferably, the leak rate of chamber 100 is less than 2 mTorr/min. (Again, this test may be skipped if a Additionally, the pre-conditioning operations may include a calibration test of the mass flow controller(s) which regulate(s) the gas flow into chamber 100.

As part of conditioning process 320, a cover topography may be positioned directly above, and preferably upon, chuck assembly 150 (step 324). Positioning of the cover topography upon the chuck may be performed before, after, or during the performance of the pre-conditioning operations.

Figure 2:
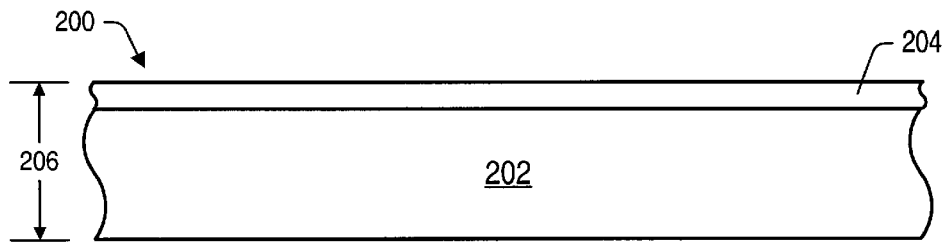
FIG. 2 is a partial cross-sectional view of a cover topography configured to cover a chuck during a conditioning process in accordance with an embodiment.

Referring to FIG. 2, a cross-sectional view of a cover topography, cover topography 200, suitable for use with the present conditioning method is shown. (Although a variety of types of cover topographies may be used in the present conditioning process, cover topography 200 will be discussed here for ease of illustration.) Cover topography 200 may include a cover substrate 202. Cover substrate 202 is preferably composed of single-crystal silicon. Oxide layer 204 preferably overlies cover substrate 204. Preferably, cover topography 200 is a dummy topography. Accordingly, cover topography 200 is preferably devoid of preformed patterns. In addition, the upper surface of cover topography 200 may be substantially planar. Cover topography 200 is preferably of sufficient dimension to cover the plasma-sensitive portions of the upper surface of a chuck, such as chuck assembly 150 shown in FIG. 1. Cover topography 200 preferably has an overall thickness 206 (which includes cover substrate 202 and oxide layer 204) immediately before conditioning is performed.

Cover topography 200 is preferably positioned on chuck assembly 150 such that the surface away from the bottom of substrate 202 is exposed to the chamber interior 160. After positioning cover topography 200 on the chuck assembly 150, a DC bias may be applied to DC electrode 151 to secure the topography. Inert cooling gases may then be flowed on the backside of cover topography 200.

Referring back to FIG. 6, after the cover topography is positioned on the chuck, the conditioning feed gas may be introduced into the etch chamber (step 326). The conditioning feed gas includes an etching component and a polymer-forming component. The polymer-forming component within the conditioning feed gas is preferably of sufficient quality and quantity that a conditioning plasma generated from the conditioning plasma may deposit polymeric material across the upper surface of the cover topography at a deposition rate at least as great as a rate at which said conditioning plasma etches the upper surface of said cover topography. The deposited polymeric material preferably forms a layer of polymeric material across the upper surface of the cover topography. Once formed, the layer of polymeric material preferably aids in preventing the etching of underlying portions of the cover topography.

The conditioning feed gas may contain (hydro) fluorocarbons. Preferably, both the etching and polymer-forming components of the feed gas contain (hydro) fluorocarbons. The polymer-forming component preferably includes a polymer-forming gas having a relatively low fluorine/carbon (F/C) ratio. The polymer-forming component preferably contains a volume percentage (in terms of the total conditioning feed gas volume) of polymer-forming gases sufficient to create a polymer-forming plasma at the desired conditioning process parameters. Preferably, the F/C ratio of the polymer-forming gas is below 3; more preferably, the F/C ratio of the polymer-forming gas is about 2. Suitable polymer-forming (hydro)fluorocarbon gases include Freon 134 ($CHF_2$-$CHF_2$), octafluorocyclobutane ($C_4F_8$) and trifluoromethane ($CHF_3$).

In an embodiment, the polymer-forming component of the conditioning gas contains Freon 134 at a flow rate of between about 0.1–30 sccm. The Freon 134 flow is preferably 1–20% total (hydro)fluorocarbon flow within the conditioning feed gas, and is more preferably about 3%. In an embodiment in which octafluorocyclobutane is contained in the polymer-forming component of the conditioning gas, the flow rates and flow percentages of octafluorocyclobutane in the polymer-forming component of the conditioning feed gas are preferably similar to that of Freon 134.

The etching component of the conditioning feed gas preferably contains one or more etching gases. The etching gases preferably have an F/C ratio of at least 4. In a preferred embodiment, the etching component contains carbon tetrafluoride ($CF_4$). The chemical composition of the etching component within the conditioning feed gas is preferably substantially the same as the chemical composition of the etching component within the etching feed gas of the corresponding etching process (e.g., step 330, outlined below).

The overall chemical composition of all (hydro) fluorocarbons within the conditioning feed gas may be expressed in the form $C_xH_yF_z$. Preferably, x is from 1 to 5, more preferably is from 1 to 4, and most preferably is 1 or 2; y is preferably from 0 to 8, more preferably is from 0 to 4, and most preferably is from 0 to 2; and z is preferably from 2 to (2x+2−y), and more preferably is (2x+2−y) when x=1 and is (2x−y) or (2x+2−y) when x is from 2 to 5. A preferred total fluorocarbon flow within the conditioning gas is between 0–200 sccm, and more preferably is between 2–100 sccm.

The conditioning feed gas may contain other non-(hydro) halocarbon gases as well. This may include reactive gases such as oxygen and inert gases such as helium and nitrogen. A preferred flow rate of the conditioning feed gas may be subdivided as follows: 0–500 sccm argon, more preferably 100 sccm argon; 0–500 sccm helium, more preferably, 0sccm helium; 0–500 sccm nitrogen, more preferably 10 sccm nitrogen; 0–100 sccm oxygen, more preferably 0 sccm oxygen. In an exemplary embodiment, in which Freon 134 is a polymer-forming gas within the conditioning feed gas, the conditioning feed gas may include: 30 sccm CF4, 40 sccm $CHF_3$, 2 sccm Freon 134, and 100 sccm Ar.

All flow rates described herein may be scaled for chamber size, as well as for other chamber-dependent factors as would be apparent to one of ordinary skill in the art. For example, the flow rates may be increased for some types of HDP etchers because of the larger pump size.

A conditioning plasma may then be generated within the etch chamber from the conditioning feed gas for a conditioning time (step 328). Generating the conditioning plasma may include applying RF power from RF power source to an electrode operably electrically coupled to the cover topography supported by the chuck within the etch chamber. In an embodiment, the conditioning plasma may be generated within chamber 100 by applying between 100 W–3000 W, and preferably 1000 W, of RF power to RF electrode 173 from RF power source 175 and applying 0 W–3000 of RF power to inductive coil 120. In an embodiment in which the chamber is an MDP etch chamber, power is preferably not supplied to an inductive coil or similar structure during plasma generation.

The pressure within the chamber may be set at a desired level prior to generating the plasma. The chamber pressure is preferably set between 5–500 mT. In an embodiment in which the etch chamber is an HDP etch chamber, the chamber pressure is preferably set at about 100 mT. In an embodiment in which the etch chamber is an MDP etch chamber, the chamber pressure is preferably set at about 8 mT. The pressure and power conditions for conditioning plasma generation in step 326 are preferably similar to or the same as the corresponding conditions for etching plasma generation in the corresponding etch process (in, e.g., step 336 below).

With the proper conditioning feed gas composition being introduced into chamber 100, generation of a conditioning plasma preferably results in deposition of polymeric material on the inner surfaces of the chamber (e.g., chamber ceiling 110, chamber sidewall 130, and chamber base 140). The conditioning plasma also preferably elevates the temperatures of chamber 100 inner surfaces. Furthermore, the present conditioning plasma may deposit polymeric material upon the upper surface of cover topography 200.

Figure 3:
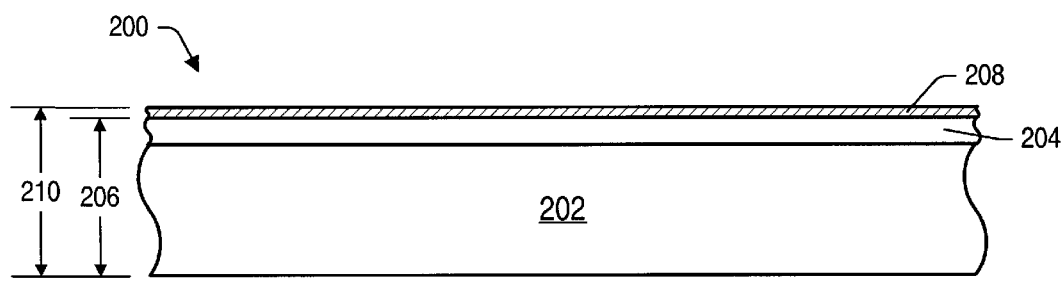
FIG. 3 is a partial cross-sectional view of the cover topography, in which a layer of polymeric material is deposited upon the upper surface of the cover topography during conditioning according to a processing step subsequent to FIG. 2.

FIG. 3 presents a cross-sectional view of a cover topography 200 after generating a conditioning plasma for a conditioning time in accordance with an embodiment in which cover topography 200 is positioned upon a chuck within the chamber being conditioned. As seen in FIG. 3, polymeric material layer 208 may be deposited on the upper surface of cover topography 200 by the conditioning plasma. Immediately after generating the conditioning plasma, cover topography 200 preferably has an overall thickness 210, which includes the additional thickness of polymeric material layer 208. Consequently, overall thickness 210 immediately after generating the conditioning plasma is preferably at least as great as overall thickness 206 immediately before generating the conditioning plasma, and is more preferably greater than immediately before generating the conditioning plasma.

The increase in the overall thickness of cover topography 200 during conditioning is preferably relatively slight, though: the deposition rate of depositing polymeric material across the surface of the cover topography may be less than 10 angstrom per minute, and is preferably less than 3 angstroms per minute. In addition, the conditioning time for which the conditioning plasma is generated is preferably between 0.5 and 10 minutes, and more is about 30 seconds. The optimal length of time for a particular conditioning process may be determined through testing. Limiting the rate and extent of polymeric deposition preferably reduces the chance that the polymeric material will flake off the cover topography and possibly interfere with the outcome of subsequent etch processes. Polymeric material deposited by the present conditioning plasma is preferably similar in composition to polymeric material deposited by the corresponding etch process.

Figure 4:
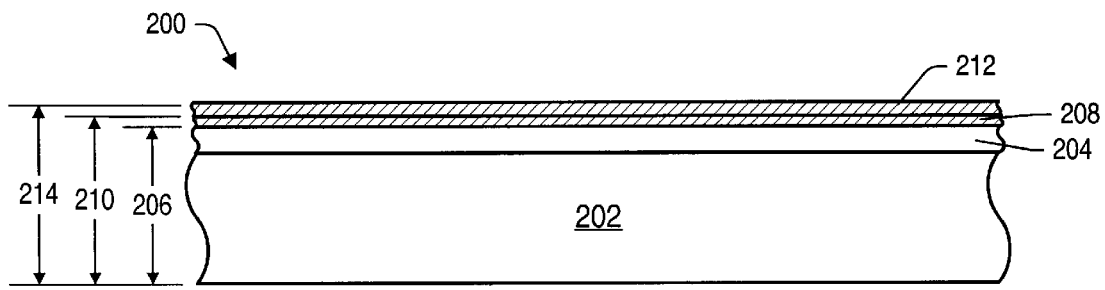
FIG. 4 is a partial cross-sectional view of the cover topography, in which an additional layer of polymeric material is deposited upon the upper surface of the cover topography during a conditioning process subsequent to FIG. 3.

Conditioning process 320 may not always be performed with a cover topography initially devoid of polymeric material upon its upper surface (as is cover topography 200 in FIG. 2); in fact, in most cases the cover topography may already be covered with polymeric material deposited in a previous processing step. As an example, FIG. 4 presents a partial cross-sectional view of cover topography 200 after undergoing a conditioning process subsequent to that shown in FIG. 3. As shown in FIG. 4, polymeric material layer 212 may be deposited upon polymeric material layer 208 during a subsequent conditioning process. Immediately prior to generating the conditioning plasma which deposits polymeric material layer 212, cover topography 200 may have an overall thickness 210 (the combined thicknesses of cover substrate 202, oxide layer 204, and polymeric material layer 208). Immediately after generating the conditioning plasma is complete, cover topography 200 may have an overall thickness 214, which includes the added thickness provided by polymeric material layer 212. Consequently, overall thickness 214 immediately after conditioning is preferably greater than overall thickness 210 immediately before conditioning.

The thicknesses of polymeric material layers 208 and 212 may not be uniform across the upper surface of the topography because of, e.g., elevated temperatures at the wafer edges causing differing deposition rates at the wafer edges. For example, when using Freon 134 as a polymer-forming gas, polymeric material layers 208 and 212 may be deposited more thickly at the edges of cover topography 200 than in the center of cover topography 200. Regardless of any thickness disparities produced over the course of conditioning, however, the overall thicknesses 210 and 214 of cover topography 200 immediately after generating the conditioning plasma are preferably at least as great as overall thicknesses 206 and 210, respectively, immediately before generating the conditioning plasma. That is, the thickness of cover topography 200 at all points across the topography immediately after generating the conditioning plasma is at least as great as the thickness at the respective points immediately before generating the conditioning plasma.

Cover topography 200 may be repeatedly used in subsequent deposition processes, and additional layers of polymeric material may then be deposited upon polymeric material layer 212. After using cover topography in several subsequent conditioning processes, several layers of polymeric material may have accumulated above cover substrate 202. Cover topography may be used in this manner for as long as desired. It may be advantageous, however, to periodically remove the accumulated polymeric layers to reduce the risk of the layers peeling off during conditioning. Such removal may only remove the accumulated polymeric material layers, leaving oxide layer 204 in place, so that afterwards the topography resembles the form depicted in FIG. 2. The sequence of processing steps depicted in FIGS. 2–4 may then be repeated.

Other types of cover topographies may be used in the present conditioning process as well. Possible cover topographies may include single-crystal silicon substrates (e.g., photoresist-covered, silicon nitride-covered, and bare) and ceramic substrates (e.g., aluminum oxide, aluminum nitride, silicon oxide, silicon nitride). Other types of topographies will be apparent to those of ordinary skill in the art having the benefit of this disclosure. In fact, since the present conditioning process preferably does not substantially etch the upper surface of semiconductor topography, production semiconductor topographies may be used as cover topographies as well, if desired.

After generation of the conditioning plasma, a variety of post-conditioning operations may be performed (step 329). For example, cover topography 200 may be removed from chuck assembly 150. The topography may then be removed from chamber 100. In addition, post-conditioning processes may include a variety of chamber qualification tests to help ensure that the chamber is sufficiently conditioned. Such tests may include: etch rate tests, which may test whether the etch rate is similar to what is expected; etch selectivity tests, which may test whether etch selectivity is within a desired range; and particle count tests, which may test whether the particle count within the chamber is within a desired range (e.g., <20 particles sized <16 microns).

In conditioning process 320, only a single cover topography is shown as being used. In some cases, however, it may be desirable to use more than one cover topography in a single conditioning process. For example, it may be desirable to minimize the deposition of polymer on each cover topography used in the conditioning process. Alternately, the amount of polymer forming component within the conditioning feed gas may be configured to merely reduce the rate of etching of the conditioning plasma relative to the corresponding etching plasma. In such a case, it may be helpful to use multiple topographies in a single process (it may also be helpful to use photoresist-covered wafers for ease of reworking). The goal conditioning time for the etch chamber is determined, as well as maximum desired conditioning time for each wafer. With that information, the number of conditioning wafers necessary may be determined.

Figure 7:
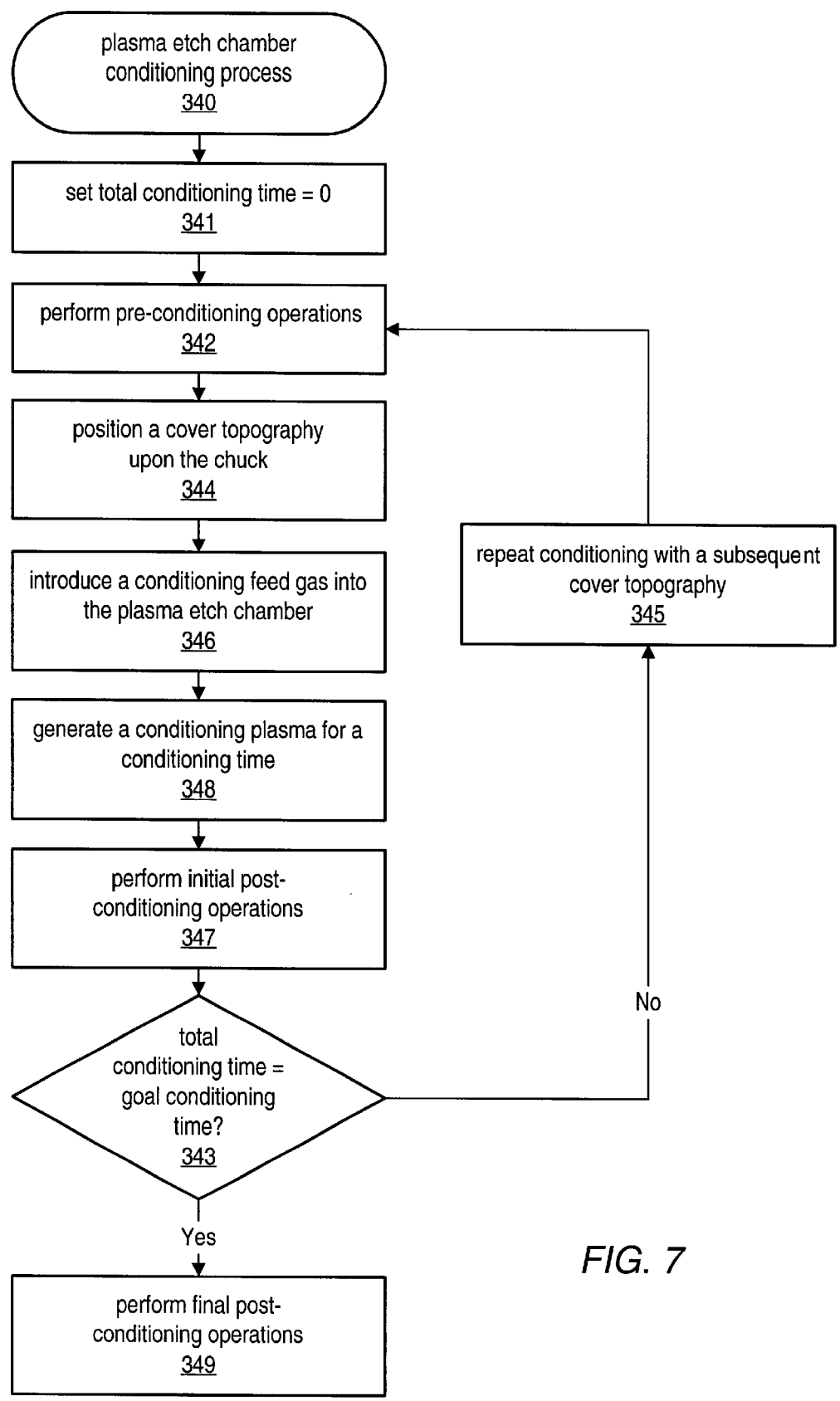
FIG. 7 is a flow diagram of a plasma etch chamber conditioning process that may be performed as part of the method shown in FIG. 5 according to an alternate embodiment.

FIG. 7 presents a flow diagram for an alternative conditioning method in which multiple topographies may be used. Conditioning process 340 may be used within operation method 300 in place of or in addition to conditioning process 320. First, the total conditioning time is set to zero (step 341). The total conditioning time is the sum total of conditioning times for all topographies used in a single implementation of conditioning process 340. Then, pre-conditioning operations may be performed (step 342); these operations may be performed in a similar fashion to pre-conditioning operations performed as part of step 322. Subsequently, the conditioning feed gas may be introduced into the plasma etch chamber (step 346); this step may be performed in similar manner as step 326. A conditioning plasma may be generated within the etch chamber for conditioning time (step 348); this step may be performed in similar manner as step 328. After generation of the conditioning plasma is complete, initial post-conditioning operations may be performed (step 347). These operations may be similar to those performed as part of step 329, except some final operations may be postponed until completion of conditioning process 340.

The total conditioning time then is the conditioning time for the first cover topography. If the total conditioning time equals the goal conditioning time (step 343), final post-conditioning operations may be performed (step 349). These operations may include operations performed as part of step 329, but not performed in step 347. If the total conditioning time does not equal the goal conditioning time, then conditioning may be repeated with a subsequent cover topography (step 345). Some portions of steps 342, 344, 346, 348, and 347 may not need to be repeated in their entirety with a second, subsequent cover topography for a second conditioning time subsequent to removing the first cover topography from the plasma etch chamber and before performing any subsequent etch processes. For example, there may not be a need to perform some of the pre-conditioning operations and post-conditioning operations. Upon completion of the steps with the second, subsequent topography, the total conditioning time will now equal the conditioning time for the first cover topography plus the conditioning time for the second, subsequent topography. If the total conditioning time still does not equal the goal conditioning time, steps 342, 344, 346, 348, and 347 may then be repeated with additional cover topographies until the goal conditioning time is attained.

Figure 8:
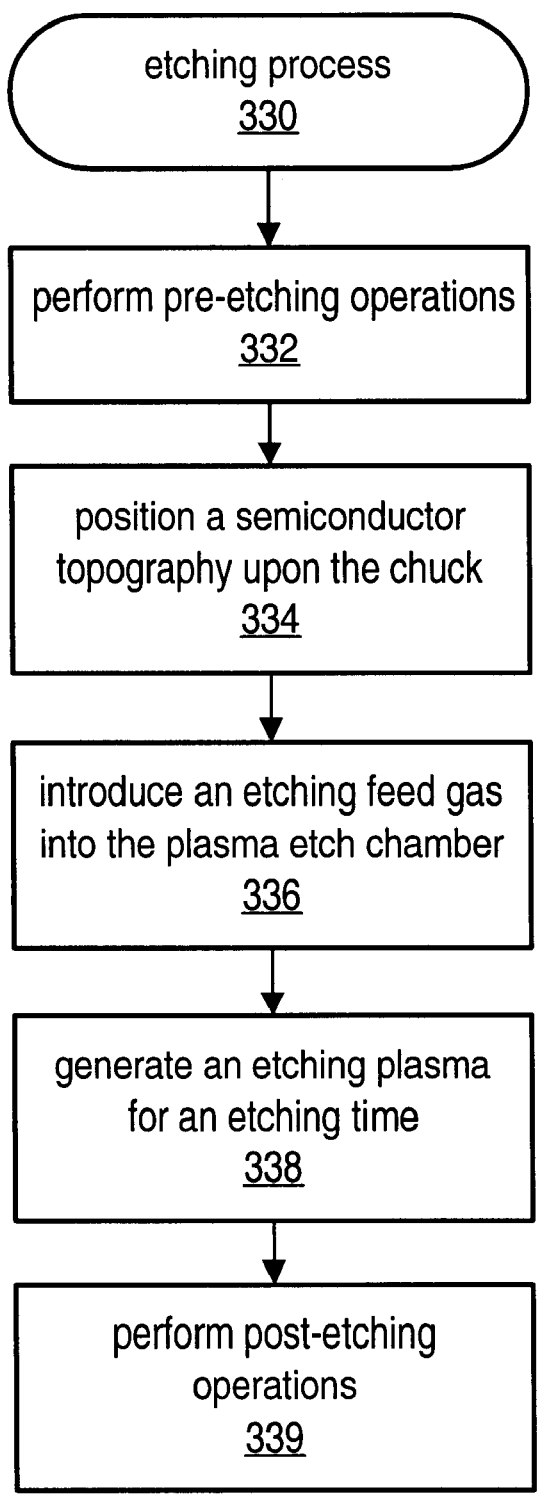
FIG. 8 is a flow diagram of an etching process that may be performed as part of the method shown in FIG. 5.

FIG. 8 presents a flow diagram of etching process 330. Etching process 330 is preferably the corresponding etch process for which chamber 100 is preferably conditioned by the present conditioning method (e.g., processes 320 or 340). The present conditioning method is preferably capable of achieving the desired benefits without significantly altering the conditioning feed gas chemistry from the etching feed gas chemistry of the etching process for which the etch chamber is being conditioned. Etching process 330 may be performed after cover topography 200 is removed from chuck assembly 150, as well as after any other intermediate steps are performed.

The etching process to preferably includes pre-etching operations to prepare a chamber 100 for generation of the etching plasma (step 332). The pre-etching operations may be performed in a manner similar to the pre-etching operations performed in step 322.

A production semiconductor topography may be positioned directly above, and preferably upon, chuck assembly 150 (step 334). The semiconductor topography preferably includes a patterned layer of photoresist demarcating the portions of the semiconductor topography to be etched during the etching process. First the semiconductor topography may also include active devices, such as MOS transistors, arranged above and within the active regions of a semiconductor substrate. In addition, isolation structures (e.g., oxide-filled isolation trenches) may be arranged at least partially within the semiconductor substrate.

An etching feed gas containing (hydro)halocarbons may then introduced into the chamber (step 336). The etching feed gas preferably includes a polymer-forming component and an etching component. The percentage of the polymer-forming component within the conditioning feed gas is preferably higher than the volume percentage of the polymer-forming component within the etching feed gas. Preferably, the chemical composition of the etching component within the conditioning feed gas is substantially the same as the chemical composition of the etching component within the etching feed gas.

The similarity between the conditioning feed gas and the etching feed gas is preferably such that exclusive of the additional volume percentage of polymer-forming component within the conditioning feed gas over the volume percentage of polymer-forming component within the etching feed gas, an overall chemical composition of the conditioning feed gas is substantially the same as an overall chemical composition of the etching feed gas. That is, the overall composition of the etching feed gas is preferably is the same as the overall composition of the conditioning feed gas except for the additional polymer-forming gas(es) which give(s) the conditioning plasma its desired properties.

The etching feed gas may include any particular configuration of gases desired for the goals of a particular etching process. For example, the etching feed gas may contain polymer-forming gases, but not of sufficient quality and quantity to prevent the etching plasma from etching material upon the upper surface of the semiconductor topography. The added polymer-forming gas(es), and thus the added volume percentage of polymer-forming component, within the conditioning feed gas over the etching feed gas is (are) preferably sufficient to at least reduce the etch rate of the conditioning plasma, and preferably is (are) sufficient to configure the conditioning plasma such that the plasma deposits polymeric material across the upper surface of a cover topography at a greater rate than that at which the conditioning plasma etches the upper surface of the cover topography. Accordingly, a difference between the volume percentage of the polymer-forming component within the conditioning feed gas and the volume percentage of the polymer-forming component within the etching feed gas is preferably between about 1–20 percent, and more preferably is about 3 percent.

Alternately, the etching feed gas may not contain any polymer-forming gases (e.g., the etching feed gas may only contain carbon tetrafluoride). In such a case, the volume percentage of the polymer-forming component within the etching feed gas may be considered to be zero.

Preferably, both the etching component and the polymer-forming component of the etching feed gas and the conditioning feed gas contain (hydro)fluorocarbons. The etching component preferably comprises a first etching (hydro) fluorocarbon gas having a F/C ratio of at least 4. The conditioning feed gas preferably contains a first polymer-forming (hydro)fluorocarbon species having an F/C ratio of at most 3. More preferably, the first polymer-forming (hydro)fluorocarbon species has an F/C of at most about 2 (e.g., Freon 134 or octafluorocyclobutane). The use of a polymer-forming gas having a low (e.g., F/C less than or equal to 2) allows for the addition of only a slight amount of polymer-forming gas (e.g. less than 102 sccm) to achieve the desired conditioning results. Such a relatively slight addition to the etching feed gas chemistry preferably does not significantly change the composition of any deposited polymeric film, although it preferably adds to the locations within the chamber where the film is deposited. For locations in which film is deposited by both the conditioning and etching plasma, the additional polymer-forming component in the conditioning feed gas may result in a higher rate of deposition for the conditioning plasma.

An etching plasma may then be generated within the etch chamber from the etching feed gas for an etching time (step 338). Generating the etching plasma may include applying RF power from RF power source to an electrode operably electrically coupled to the cover topography supported by the chuck within the etch chamber. The supplying of power to electrodes of chamber 100 to form the etching plasma is preferably similar to or the same as the supply of power to electrodes of chamber 100 to form the conditioning plasma.

After generation of the etching plasma, a variety of post-etching operations may be performed (step 339). These post-etching operations may be performed in a manner similar to the post-etching operations performed in step 329. While etching process 330 is shown herein as a single-step etching process, it would be apparent to one of ordinary skill in the art having the benefit of this disclosure that multiple-step etching processes are available as well.

It should be understood that the present conditioning method may be utilized to condition plasma etch reactors for a variety of etch processes. The selection of an appropriate quantity of polymer-forming component within the conditioning feed gas to create a conditioning plasma having the desired properties will be apparent to one of ordinary skill in the art having the benefit of this disclosure.

It will be appreciated by those skilled in the art having the benefit of this disclosure that this invention is believed to provide a method for conditioning plasma etch chambers in which, e.g., a cover topography is positioned upon a chuck within the chamber and a conditioning plasma is generated such that the thickness of the cover topography immediately after generating the conditioning plasma is at least as great as the thickness of the cover topography immediately before generating the conditioning plasma. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for conditioning a plasma etch chamber, comprising:
   positioning a cover topography on or over a chuck in the chamber; and
   generating a conditioning plasma from a conditioning feed gas comprising one or more (hydro)halocarbons for a conditioning time, wherein an overall thickness of the cover topography immediately after generating said conditioning plasma is at least as great as immediately before generating said conditioning plasma.

2. The method of claim 1, wherein the overall thickness of the cover topography is greater immediately after generating said conditioning plasma than immediately before generating said conditioning plasma.

3. The method of claim 2, wherein said generating said conditioning plasma for a conditioning time comprises depositing polymeric material on the surface of the cover topography.

4. The method of claim 2, wherein a deposition rate of said depositing polymeric material is less than 3 angstroms per minute.

5. The method of claim 1, wherein the conditioning feed gas comprises an etching component and a polymer-forming component, and wherein the etching component comprises a first (hydro)fluorocarbon and the polymer-forming component comprises a second (hydro)fluorocarbon.

6. The method of claim 5, wherein the second (hydro)fluorocarbon comprises a compound of the formula $C_xH_yF_z$, wherein x is from 1 to 5, y is from 0 to 8, and z is from 2 to (2x+2−y).

7. The method of claim 5, wherein the second (hydro)fluorocarbon has a F/C ratio of about 2.

8. The method of claim 1, wherein the cover topography comprises a dummy topography.

9. The method of claim 8, wherein the cover topography further comprises a single-crystal silicon substrate.

10. The method of claim 9, wherein the cover topography further comprises an oxide layer overlying the substrate.

11. The method of claim 1, wherein said conditioning time is from about 0.5 minutes to about 10 minutes.

12. A method for conditioning a plasma etch chamber, comprising:
    positioning a cover topography on or over a chuck in the plasma etch chamber; and
    generating a conditioning plasma from a conditioning feed gas comprising an etching component and a polymer-forming component for a time sufficient to deposit polymeric material on the upper surface of the cover topography, wherein a deposition rate of said depositing polymeric material is at least as great as a rate at which said conditioning plasma etches the upper surface of said cover topography.

13. The method of claim 12, wherein said depositing said polymeric material comprises forming a layer of polymeric material across the cover topography, wherein the layer of polymeric material inhibits or prevents the conditioning plasma from etching underlying materials.

14. The method of claim 12, wherein said generating said conditioning plasma comprises depositing polymeric material on one or more inner surfaces of the chamber.

15. The method of claim 13, wherein the polymer-forming species comprises a compound of the formula $C_2H_2F_4$.

16. The method of claim 12, wherein the etching component comprises a first (hydro)fluorocarbon and the polymer-forming component comprises a second (hydro)fluorocarbon.

17. The method of claim 16, wherein the second (hydro)fluorocarbon has a F/C ratio of about 2.

18. A method for operating a plasma etch chamber, comprising:
    generating a conditioning plasma from a conditioning feed gas for a conditioning time in the plasma etch chamber, wherein the plasma etch chamber contains a cover topography on a chuck, and the conditioning feed gas comprises a polymer-forming (hydro)halocarbon component and an etching component;
    removing the cover topography from the chuck;

etching a substrate in the plasma etch chamber after generating said conditioning plasma.

19. The method of claim 18, wherein at least one etching component of the conditioning feed gas is substantially the same as an etching component of the etching feed gas.

20. The method of claim 19, wherein said etching comprises generating an etching plasma from an etching feed gas comprising a polymer-forming component and an etching component, and wherein the volume percentage of the polymer-forming component within the conditioning feed gas is higher than the volume percentage of the polymer-forming component within the etching feed gas.

* * * * *